United States Patent
Xue

(10) Patent No.: US 8,643,415 B1
(45) Date of Patent: Feb. 4, 2014

(54) PHASE-LOCKED LOOP HAVING A CONSTANT DAMPING RATIO

(71) Applicant: Micrel, Inc., San Jose, CA (US)

(72) Inventor: Dashun Xue, Austin, TX (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 13/657,683

(22) Filed: Oct. 22, 2012

(51) Int. Cl.
*H03L 7/06* (2006.01)

(52) U.S. Cl.
USPC .......................... 327/157; 327/148; 327/156

(58) Field of Classification Search
USPC .................. 327/147–161, 551–559
See application file for complete search history.

(56) References Cited

U.S. PATENT DOCUMENTS

| 7,764,092 B2 | 7/2010 | Jung et al. |
| 7,772,931 B2 * | 8/2010 | Nakamura ....................... 331/16 |
| 8,019,565 B2 * | 9/2011 | Bokui et al. ................... 702/107 |
| 2007/0164829 A1 * | 7/2007 | Ko .................................... 331/17 |
| 2008/0218277 A1 * | 9/2008 | Tan et al. ......................... 331/17 |

* cited by examiner

*Primary Examiner* — Dinh T. Le
(74) *Attorney, Agent, or Firm* — Van Pelt, Yi & James LLP

(57) ABSTRACT

A filter circuit in a phase-locked loop circuit includes a capacitor coupled between a control voltage node and a first node; and a variable resistive element coupled between the first node and a ground potential. The variable resistive element has a resistance value modulated by a current proportional to the charge pump current of the charge pump. In one embodiment, the variable resistive element is a MOS transistor biased in the linear region and having a drain-to-source resistance modulated by the current proportional to the charge pump current.

9 Claims, 2 Drawing Sheets

PHASE-LOCKED LOOP HAVING A CONSTANT DAMPING RATIO

BACKGROUND OF THE INVENTION

A phase-locked loop (PLL) is an electrical circuit that controls an oscillator so that the oscillator maintains a constant phase angle relative to a reference signal. In general, a PLL is formed by a phase detector, a charge pump, a low pass filter, and a voltage-controlled oscillator (VCO). The PLL receives an input signal and operates to control the VCO to lock to the frequency indicated by the input signal so that the output oscillating signal of the VCO maintains a fixed phase relationship with the input signal.

FIG. 1 is a schematic diagram of a conventional phase-locked loop (PLL) circuit. Referring to FIG. 1, a phase-locked loop (PLL) circuit 10 receives an input signal 12 having an input frequency $f_{in}$ and generates an output signal 22 having an output frequency $f_{out}$ where the output signal 22 has a fixed relation to the phase of the input signal 12. The PLL circuit 10 includes a phase and frequency detector (PFD) 14, a charge pump 16, a low pass filter 18 and a voltage controlled oscillator (VCO) 20. The low pass filter 18, also referred to as a loop filter, is typically implemented as a serial connection of a capacitor C1 and a resistor R1. PLL circuit 10 also includes a feedback frequency divider 24 forming a negative feedback loop. The feedback frequency divider 24 receives the output signal 22 and generates a feedback signal 26 having a divided-down feedback frequency $f_{fb}$. The feedback signal 26 is coupled to the phase and frequency detector 14 to form the feedback loop.

The operation of PLL 10 is well known. The phase and frequency detector 14 compares the phase difference between the input signal 12 and the feedback signal 26. The phase difference is used to control the charge pump 16 which drives a control voltage node 17 to generate a control voltage $V_{CTL}$ for controlling the VCO 20. The control voltage node 17 is coupled to the low-pass filter 18 to filter out high frequency changes at the control voltage $V_{CTL}$. The voltage-controlled oscillator (VCO) 20 generates the output signal 22 having a fixed relation to the phase of the input signal. The output signal 22 is fed back to the phase and frequency detector 14 through the feedback frequency divider 24.

For stability of operation and good transient response, it is generally desirable for the PLL circuit to have a constant damping ratio. The damping ratio of a PLL circuit using charge pump is generally a function of the resistance (R1) in the low pass filter, the current $I_{CP}$ provided by the charge pump and the gain of the VCO. However, because of fabrication process variations and operational voltage and temperature variations, the resistance in the low pass filter and the charge pump current can have large variations, such as 30% or more. As a result, the damping ratio in a conventional PLL circuit is not constant but instead can vary over a wide range due to the manufacturing process or can vary during circuit operation. The damping ratio variation of the conventional PLL circuit negatively impacts the stability and transient response of the circuit.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a phase-locked loop (PLL) circuit uses a variable resistive element in the low pass filter where the resistance is modulated by the charge pump current. In this manner, the PLL circuit achieves a constant damping ratio where the damping ratio is independent of process variations and also independent of operation voltage and temperature variations. The PLL circuit of the present invention realizes improved stability and improved transient response.

Figure 1:
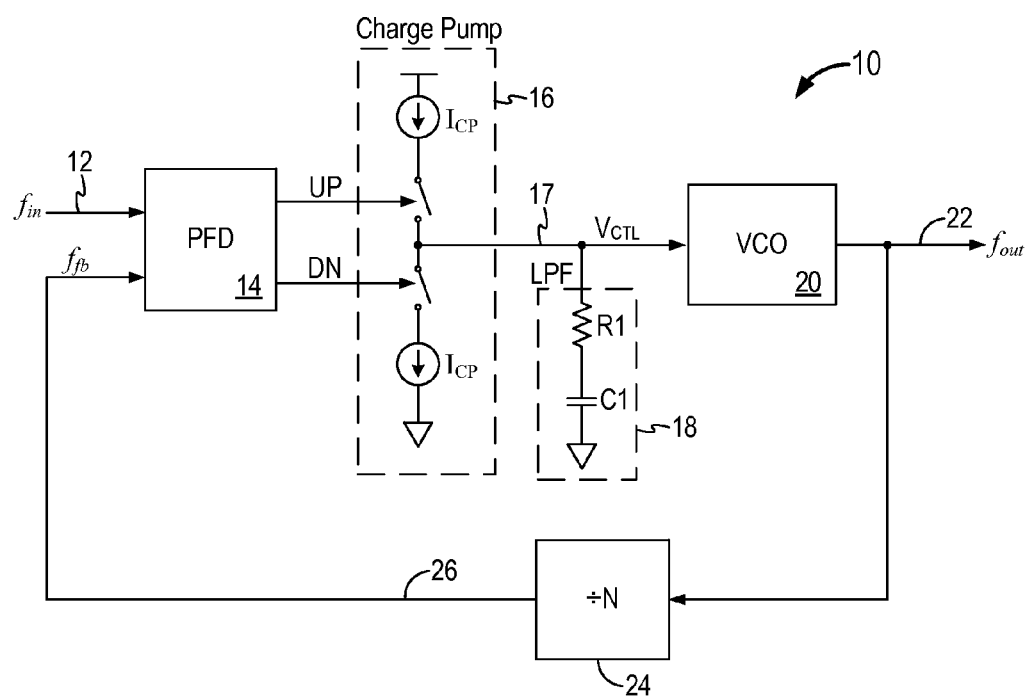
FIG. 1 is a schematic diagram of a conventional phase-locked loop (PLL) circuit.
Figure 2:
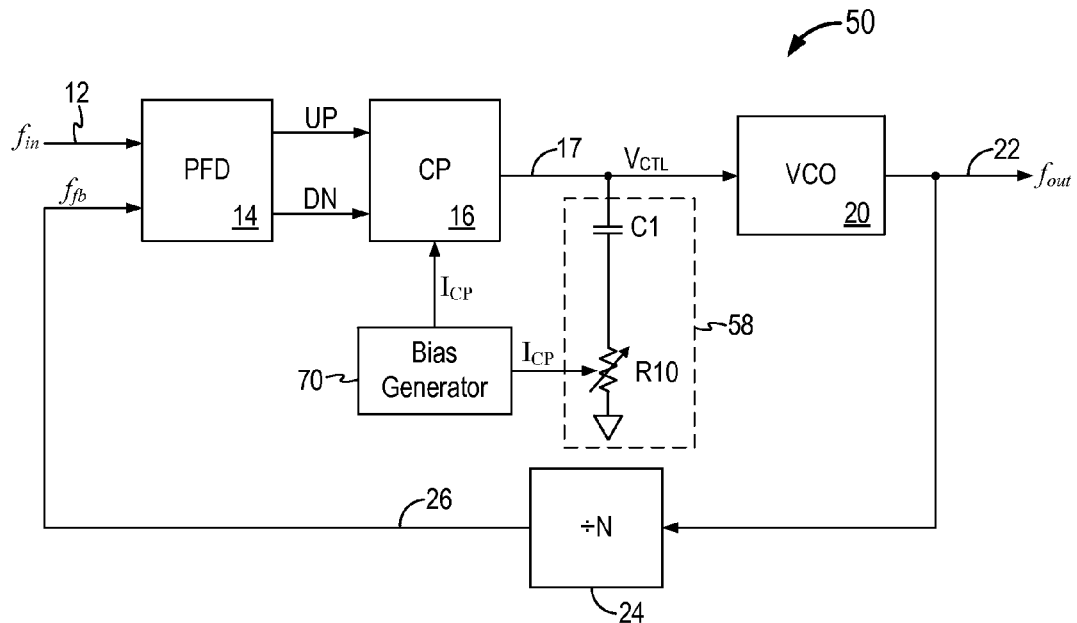
FIG. 2 is a schematic diagram illustrating an embodiment of a phase-locked loop (PLL) circuit.

FIG. 2 is a schematic diagram illustrating an embodiment of a phase-locked loop (PLL) circuit. Referring to FIG. 1, a phase-locked loop (PLL) circuit 50 receives an input signal 12 having an input frequency $f_{in}$ and generates an output signal 22 having an output frequency $f_{out}$ where the output signal 22 has a fixed relation to the phase of the input signal 12. The PLL circuit 50 includes a phase and frequency detector (PFD) 14, a charge pump 16, a low pass filter 58 and a voltage controlled oscillator (VCO) 20. A bias generator 70 generates the charge pump current $I_{CP}$ for the charge pump 16. PLL circuit 10 also includes a feedback frequency divider 24 forming a negative feedback loop. The feedback frequency divider 24 receives the output signal 22 and generates a feedback signal 26 having a divided-down feedback frequency $f_{fb}$. The feedback signal 26 is coupled to the phase and frequency detector 14 to form the feedback loop.

The PLL circuit 50 operates as follows. The phase and frequency detector 14 compares the phase difference between the input signal 12 and the feedback signal 26. The phase difference is used to control the charge pump 16 which drives a control voltage node 17 to generate a control voltage $V_{CTL}$ for controlling the VCO 20. For instance, the phase and frequency detector 14 may generate an Up and Down to direct the charge pump 16 to charge or discharge control voltage node 17 in response to the phase difference between the input signal and the feedback signal. The control voltage node 17 is coupled to the low-pass filter 58 to filter out high frequency changes at the control voltage $V_{CTL}$. The voltage-controlled oscillator (VCO) 20 generates the output signal 22 having a fixed relation to the phase of the input signal. The output signal 22 is fed back to the phase and frequency detector 14 through the feedback frequency divider 24.

In PLL circuit 50, the low pass filter 58, also referred to as a loop filter, is implemented using a serial connection of a capacitor C1 and a variable resistive element R10 between the control voltage node 17 and the ground potential. The resistance of the variable resistive element R10 is modulated by a current which is proportional to the charge pump current $I_{CP}$. In this manner, the damping ratio of the PLL circuit 50 can be made constant or nearly constant. More specifically, the damping ratio of the PLL circuit 50 can be made independent of process variations and also independent of operational voltage and temperature variations.

Figure 3:
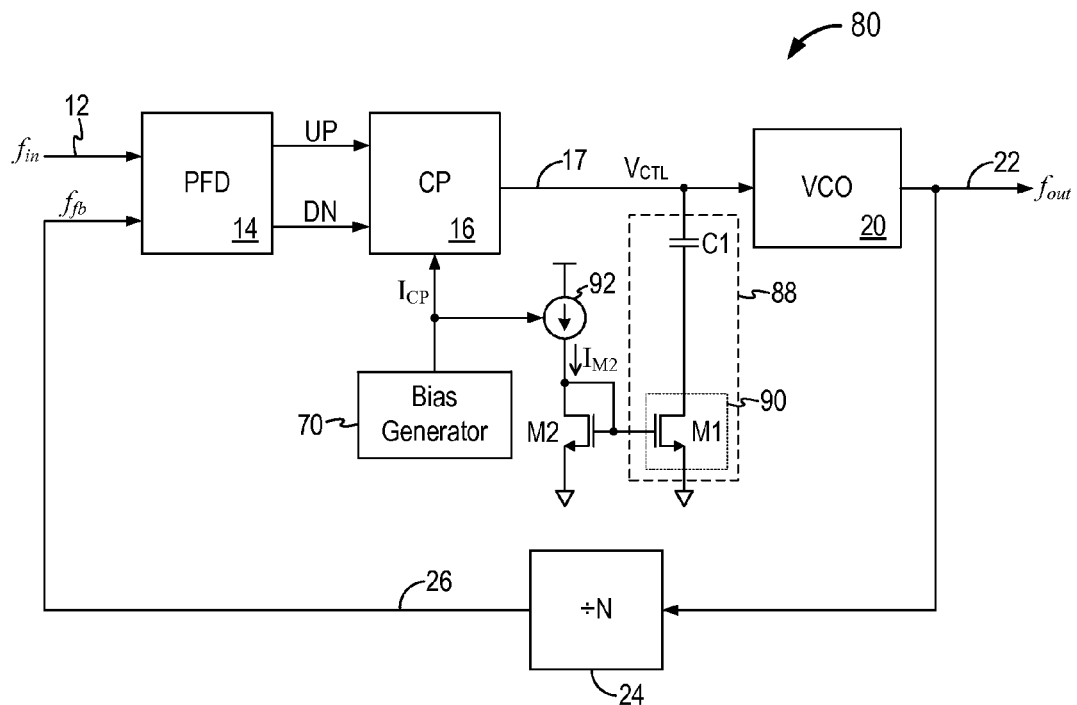
FIG. 3 is a schematic diagram illustrating one embodiment of a variable resistive element circuit which can be incorporated in the phase-locked loop (PLL) circuit of FIG. 2.

FIG. 3 is a schematic diagram illustrating one embodiment of a variable resistive element circuit which can be incorporated in the phase-locked loop (PLL) circuit of FIG. 2. Like elements in FIGS. 2 and 3 are given like reference numerals and will not be further described. Referring to FIG. 3, a PLL circuit 80 includes a low pass filter or loop filter 88 formed by a capacitor C1 and a variable resistive element 90 connected in series between the control voltage node 17 and the ground potential. In the present embodiment, the variable resistive element 90 is realized by a MOS transistor device M1 biased in the linear region where the transistor M1 is driven by a current proportional to the charge pump current $I_{CP}$. In this manner, the PLL circuit's damping ratio is made independent of the resistance of the low pass filter and independent of the charge pump current so that the PLL damping ratio has a constant or stable value. More specifically, a MOS transistor device biased in the linear region operates as a resistor with substantially linear resistance. The MOS transistor device thus biased is used to replace the fixed value resistor in the low pass filter in a conventional PLL circuit.

More specifically, the variable resistive element 90 is formed by the MOS transistor M1 biased in the linear region by a diode-connected MOS transistor M2 which mirrors a current related to the charge pump current $I_{CP}$ to drive the MOS transistor M1. In the present embodiment, the charge pump current $I_{CP}$ is coupled to drive a current source 92 which generates a current $I_{M2}$ being proportional to the charge pump current $I_{CP}$. The current $I_{M2}$ is provided to the MOS transistor M2 what is diode-connected. That is, MOS transistor M2 has its drain and gate terminals shorted together. The gate terminal of MOS transistor M2 is connected to the gate terminal of MOS transistor M1 so that transistors M1 and M2 form a current mirror. As thus configured, MOS transistor M1 is biased in the linear region where the drain-to-source resistance of transistor M1 is linear and is modulated by the mirrored current $I_{m2}$ which is related to the charge pump current $I_{CP}$. The drain-to-source resistance of transistor M1 forms the resistor for the low pass filter circuit 88 in the PLL circuit 80.

In embodiments of the present invention, the transistors M1 and M2 are implemented using N-type MOS devices or NMOS devices. In some embodiments, the current source 92 is implemented as a PMOS transistor. The PMOS transistor has a source terminal coupled to a positive power supply voltage, a drain terminal coupled to the drain of MOS transistor M2 and a gate terminal coupled to receive the charge pump current $I_{CP}$. Furthermore, in embodiments of the present invention, the current $I_{M2}$ may have the same current value or a different current value as the charge pump current $I_{CP}$ but current $I_{M2}$ is proportional to the charge pump current $I_{CP}$.

In the present embodiment, the linear region of a MOS transistor refers to the operation region of the MOS transistor where the gate-to-source voltage $V_{GS}$ is greater than the transistor threshold voltage $V_{th}$ but the drain-to-source voltage $V_{DS}$ of the transistor is less than the gate-to-source voltage $V_{GS}$ less the threshold voltage Vth. More specifically, the linear region of the MOS transistor is defined as the operation region where $V_{GS} > V_{th}$ and $V_{DS} < (V_{GS} - V_{th})$. In the linear region, the MOS transistor operates like a resistor where the resistance is substantially linear and is controlled by the gate voltage relative to both the source and drain voltages.

The use of a MOS transistor device biased in the linear region and having its drain-to-source resistance modulated by a current proportional to the charge pump current realizes many advantages over the use of a conventional fixed value resistor. In the conventional PLL circuit where the low pass filter is implemented using a fixed value resistor, the damping ratio $\xi$ is given as:

$$\xi = \frac{1}{2} R \sqrt{\frac{I_{CP} \cdot K_{VCO}}{2\pi \cdot N}},$$

where R is the resistance of the loop filter resistor (e.g. R1 in FIG. 1);

$I_{CP}$ is the charge pump current;

$K_{VCO}$ is the gain of the VCO; and

N is the feedback frequency divider ratio.

As observed from the equation above, the damping ratio of a conventional PLL circuit using a fixed value resistor is a function of the resistance R of the loop filter resistor, the charge pump current $I_{CP}$ and the gain of the VCO. Because the values of resistance R and the charge pump current $I_{CP}$ can vary a lot over process and operation conditions, the damping ratio of a conventional PLL circuit becomes variable which negatively impacts the stability and transient response of the PLL circuit. In particular, variations in the damping ratio may cause ringing at the output of the PLL circuit so that the output signal may take a long time to settle.

When a PLL circuit is implemented using the variable resistive element in accordance with the embodiments of the present invention, the resistance of the variable resistive element becomes the resistance of the MOS transistor M1 biased in the linear region. The resistance of MOS transistor M1 is given as:

$$R_{M1} = \frac{1}{\beta_{M1}} \sqrt{\frac{\beta_{M2}}{2 \cdot I_{M2}}},$$

where $\beta$ is the transconductance of the respective MOS device; and $I_{M2}$ is the current flowing in transistor M1.

By substituting the equation for the resistance $R_{M1}$ of MOS transistor M1 into the damping ratio equation given above, the damping ratio $\xi'$ of the PLL circuit 80 is given as:

$$\xi' = \frac{1}{2} \frac{1}{\beta_{M1}} \sqrt{\frac{\beta_{M2}}{2 \cdot I_{M2}}} \sqrt{\frac{I_{CP} \cdot K_{VCO}}{2\pi \cdot N}}.$$

As can be observed from the equation above, when a MOS transistor biased in the linear region using a current proportional to the charge pump current is used as the resistive element in the low pass filter of the PLL circuit, the damping ratio of the PLL circuit no longer depends on a fixed resistance value as the transconductance β values of transistors M1 and M2 cancel each other out. Also, the damping ratio of the PLL circuit is not dependent on the charge pump current as the charge pump current $I_{CP}$ term is canceled out by the proportional current $I_{M2}$ ($I_{CP} \propto I_{M2}$). The damping ratio ξ' becomes a constant value over process and operation condition variations. The stability of the PLL circuit is greatly improved.

In the above-described embodiments, a MOS transistor device is used to implement the variable resistive element. In other embodiments, other transistor devices that can be biased in a linear region of operation may be used.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A filter circuit in a phase-locked loop circuit including a phase and frequency detector configured to receive an input signal and a feedback signal and generate one or more control signals for controlling a charge pump in response to the phase difference between the input signal and the feedback signal, wherein the charge pump is coupled to receive a charge pump current from a bias generator and, in response to the one or more control signals generated by the phase and frequency detector, the charge pump provides the charge pump current generated by the bias generator to drive a control voltage node to control a voltage-controlled oscillator to generate an output signal having a fixed relation to the phase of the input signal, the filter circuit comprising:

a capacitor coupled between the control voltage node and a first node; and a variable resistive element coupled between the first node and a ground potential and coupled to the bias generator, the variable resistive element having a resistance value that is varied in response to a current proportional and related to the charge pump current of the charge pump so that the resistance value of the variable resistive element varies with changes in the charge pump current.

2. The filter circuit of claim 1, wherein the variable resistive element comprises:

a first transistor having a first current terminal coupled to the first node, a second current terminal coupled to the ground potential, and a control terminal coupled to receive the current proportional and related to the charge pump current to operate the first transistor in a linear region.

3. The filter circuit of claim 2, further comprising:

a current source configured to generate the current proportional and related to the charge pump current; and a second transistor having a first current terminal and a control terminal connected together and coupled to the current source, a second current terminal coupled to the ground potential, wherein the control terminal of the second transistor is coupled to the control terminal of the first transistor, thereby biasing the control terminal of the first transistor using the current proportional and related to the charge pump current.

4. The filter circuit of claim 3, wherein the first transistor comprises a first MOS transistor and the second transistor comprises a second MOS transistor, wherein the first MOS transistor has a drain terminal coupled to the first node, a source terminal coupled to the ground potential, and a gate terminal; and the second MOS transistor has a drain terminal coupled to the current source, a source terminal coupled to the ground potential and a gate terminal connected to the drain terminal, the gate terminal of second MOS transistor being connected to the gate terminal of the first MOS transistor.

5. The filter circuit of claim 4, wherein the first MOS transistor and the second MOS transistor comprise NMOS transistors.

6. The filter circuit of claim 5, wherein current source comprises a PMOS transistor having a source terminal coupled to a first power supply voltage, a drain terminal coupled to the drain terminal of the second MOS transistor and a gate terminal coupled to receive the charge pump current.

7. The filter circuit of claim 2, wherein the first transistor is controlled by the current proportional and related to the charge pump current to operate in the linear region where the first transistor has a substantially linear resistance value between the first and second current terminals, the resistance value being varied in response to the current proportional and related to the charge pump current.

8. The filter circuit of claim 2, wherein the current proportional and related to the charge pump current has the same or different current value as the charge pump current and is proportional and related to the charge pump current.

9. The filter circuit of claim 1, wherein the current proportional to the charge pump current is generated by the bias generator that also generates the charge pump current.

* * * * *